(12) United States Patent
Chen et al.

(10) Patent No.: US 12,205,940 B2
(45) Date of Patent: *Jan. 21, 2025

(54) SEMICONDUCTOR PACKAGE STRUCTURE AND PACKAGING METHOD THEREOF

(71) Applicant: YANGTZE MEMORY TECHNOLOGIES CO., LTD., Wuhan (CN)

(72) Inventors: Peng Chen, Wuhan (CN); Houde Zhou, Wuhan (CN); Xinru Zeng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,516

(22) Filed: Jun. 15, 2023

(65) Prior Publication Data

US 2023/0343773 A1 Oct. 26, 2023

Related U.S. Application Data

(63) Continuation of application No. 17/301,309, filed on Mar. 31, 2021, now Pat. No. 11,721,686, which is a
(Continued)

(51) Int. Cl.
*H01L 25/00* (2006.01)
*H01L 21/56* (2006.01)
(Continued)

(52) U.S. Cl.
CPC ............ *H01L 25/50* (2013.01); *H01L 21/565* (2013.01); *H01L 24/48* (2013.01); *H01L 24/49* (2013.01);
(Continued)

(58) Field of Classification Search
CPC ................ H01L 2225/06562; H01L 21/565
See application file for complete search history.

(56) References Cited

U.S. PATENT DOCUMENTS

2010/0193930 A1* 8/2010 Lee .................. H01L 24/24
257/E23.173
2014/0312503 A1 10/2014 Seo
2018/0090468 A1 3/2018 Glennan et al.

FOREIGN PATENT DOCUMENTS

CN 102487051 A 6/2012
CN 104094401 A 10/2014
(Continued)

OTHER PUBLICATIONS

The World Intellectual Property Organization (WIPO), International Search Report for PCT/CN2021/078056, Nov. 30, 2021, 4 pages.

*Primary Examiner* — Yu-Hsi D Sun
(74) *Attorney, Agent, or Firm* — BAYES PLLC

(57) ABSTRACT

A semiconductor package structure includes a substrate, including first conductive pads and packaging pads opposite to the first conductive pads, one or more semiconductor chips stacking on the substrate, a molding compound encapsulating the semiconductor chips, first metal wires connecting the semiconductor chips to the packaging pads, a first metal pad on a side of the molding compound opposite to the substrate, and a second metal wire located in the molding compound and connecting the first metal pad to a chip-contact pad of a semiconductor chip of the semiconductor chips.

19 Claims, 19 Drawing Sheets

Related U.S. Application Data continuation of application No. PCT/CN2021/078056, filed on Feb. 26, 2021.

(51) Int. Cl.
  *H01L 23/00* (2006.01)
  *H01L 25/065* (2023.01)

(52) U.S. Cl.
  CPC .............. *H01L 24/73* (2013.01); *H01L 24/85* (2013.01); *H01L 25/0652* (2013.01); *H01L 25/0657* (2013.01); *H01L 24/32* (2013.01); *H01L 2224/32145* (2013.01); *H01L 2224/32225* (2013.01); *H01L 2224/33181* (2013.01); *H01L 2224/43985* (2013.01); *H01L 2224/48227* (2013.01); *H01L 2224/4903* (2013.01); *H01L 2224/73215* (2013.01); *H01L 2224/73265* (2013.01); *H01L 2225/0651* (2013.01); *H01L 2225/06562* (2013.01)

(56) References Cited

FOREIGN PATENT DOCUMENTS

| | | | |
|---|---|---|---|
| CN | 106505045 | A | 3/2017 |
| CN | 110783301 | A | 2/2020 |
| CN | 111834330 | A | 10/2020 |
| JP | 2007123595 | A | 5/2007 |

\* cited by examiner

SEMICONDUCTOR PACKAGE STRUCTURE AND PACKAGING METHOD THEREOF

CROSS-REFERENCE TO RELATED APPLICATIONS

This application is a continuation of U.S. application Ser. No. 17/301,309, filed on Mar. 31, 2021, issued as U.S. Pat. No. 11,721,686, which is a continuation of International Application No. PCT/CN2021/078056, filed on Feb. 26, 2021, both of which are incorporated herein by reference in their entireties.

FIELD OF THE DISCLOSURE

The present disclosure generally relates to the field of semiconductor fabrication technology and, more particularly, relates to a semiconductor package structure and a packaging method thereof.

BACKGROUND

In current packaging technology, semiconductor chips need to be attached to a base substrate, and after using metal wires to electrically connect contacts on the semiconductor chips to contact pads disposed on the base substrate, the structure is sealed to form a semiconductor package structure. Usually, the semiconductor package structure has a cuboid shape with six surfaces, and a plurality of conductive structures (e.g., a plurality of solder balls) is formed on the exposed surface of the base substrate. That is, the plurality of conductive structures is only formed on one of the six surfaces of the cuboid. The three-dimensional semiconductor package structure may then be connected to a print circuit board (PCB) through the plurality of conductive structures.

After multiple device components, including semiconductor package structures, are connected to a PCB, electrical signals can be exchanged between different components through metal lines disposed in conductive layers of the PCB. Because the electrical connections between each semiconductor package structure and other device components must go through the surface where the plurality of conductive structures is formed, to maintain a certain density of connection wires, the connection wires may need to be long. However, long wires are known to induce noise and cause signal loss, especially when the semiconductor device is operating at a high frequency. In addition, because all the connections need to be designed in a same plane, the two-dimensional layout is large and thus may not be conducive to the miniaturization of semiconductor devices. Moreover, with all the connection wires arranged in a single PCB, the fabrication of the semiconductor structure may be more complicated and the production cost may be more expensive.

The disclosed semiconductor package structure and packaging method are directed to solve one or more problems set forth above and other problems in the art.

BRIEF SUMMARY OF THE DISCLOSURE

One aspect of the present disclosure provides a packaging method. The packaging method includes providing a substrate structure, including a core substrate, a plurality of first conductive pads at a first surface of the core substrate, and a plurality of packaging pads at a second surface of the core substrate opposite to the first surface; and packaging a plurality of semiconductor chips onto the substrate structure at the second surface of the core substrate, including forming a first metal wire to connect with a chip-contact pad of a semiconductor chip, and forming a molding compound on the second surface of the core substrate to encapsulate the plurality of semiconductor chips. One end of the first metal wire connects to the chip-contact pad, and another end of the first metal wire is exposed at the surface of the molding compound. The packaging method further includes forming a first metal pad on the surface of the molding compound to electrically connect with the first metal wire.

Another aspect of the present disclosure provides a semiconductor package structure. The semiconductor package structure includes a substrate structure, including a core substrate, a plurality of first conductive pads at a first surface of the core substrate, and a plurality of packaging pads at a second surface of the core substrate opposite to the first surface; a plurality of semiconductor chips attached to the substrate structure at the second surface of the core substrate; a molding compound, formed on the second surface of the core substrate and encapsulating the plurality of semiconductor chips; a first metal pad formed on a surface of the molding compound; and a first metal wire located in the molding compound and connecting the first metal pad to a chip-contact pad of a semiconductor chip.

Another aspect of the present disclosure provides a packaging method. The packaging method includes providing a substrate structure, including a core substrate, a plurality of first conductive pads at a first surface of the core substrate, and a plurality of packaging pads at a second surface of the core substrate opposite to the first surface; and attaching a plurality of semiconductor chips and an interpolation substrate onto the substrate structure at the second surface of the core substrate. The interpolation substrate includes a substrate-contact pad and a second conductive pad electrically connected to the substrate-contact pad. The packaging method further includes forming a first metal wire to connect the substrate-contact pad of the interpolation substrate to a chip-contact pad of a semiconductor chip; and forming a molding compound on the second surface of the core substrate to encapsulate the plurality of semiconductor chips. The molding compound covers the substrate-contact pad of the interpolation substrate and exposes the second conductive pad.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
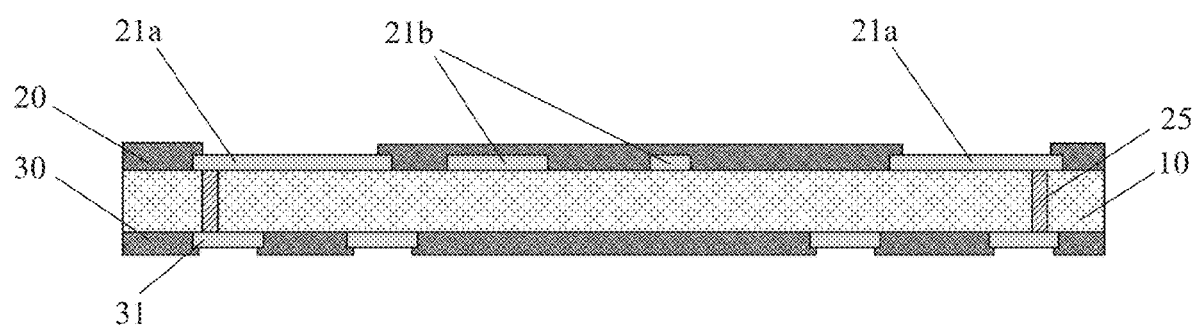
FIGS. 1-4 illustrate schematic views of semiconductor structures at certain stages of a packaging method.

Reference will now be made in detail to exemplary embodiments of the invention, which are illustrated in the accompanying drawings. Wherever possible, the same reference numbers will be used throughout the drawings to refer to the same or like parts.

Although specific configurations and arrangements are discussed, it should be understood that this is done for illustrative purposes only. A person skilled in the pertinent art should recognize that other configurations and arrangements can be used without departing from the spirit and scope of the present disclosure. It will be apparent to a person skilled in the pertinent art that the present disclosure can also be employed in a variety of other applications.

It should be noted that references in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath", "below", "lower", "above", "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings", such as NAND memory strings) on a laterally-oriented substrate so that the memory strings extend in the vertical direction with respect to the substrate. As used herein, the term "vertical/vertically" means nominally perpendicular to the lateral surface of a substrate.

FIG. 1 illustrates a schematic cross-sectional view of a base substrate for packaging. Referring to FIG. 1, the base substrate includes a core substrate 10, including a first surface and a second surface opposite to the first surface. The base substrate further includes a plurality of packaging pads 21a, a plurality of conductive lines 21b, and a first solder resist (SR) layer 20 disposed on the first surface of the core substrate 10, and a plurality of solder pads 31 and a second SR layer 30 disposed on the second surface of the core substrate 10. The first SR layer 20 covers the first surface of the core substrate 10 and the plurality of conductive lines 21b, and the second SR layer 30 covers the second surface of the core substrate 10. Each packaging pad 21a of the plurality of packaging pads 21a is at least partially exposed by the first SR layer 20. Each solder pad 31 of the plurality of solder pads 31 is at least partially exposed by the second SR layer 30. Therefore, the second SR layer 30 serves as a solder mask for subsequent formation of solder balls. Further, the base substrate also includes a plurality of contact plugs 25 disposed through the core substrate 10 and each connecting a packaging pad 21a on the first surface of the core substrate 10 and a solder pad 31 on the second surface of the core substrate 10.

Figure 2:
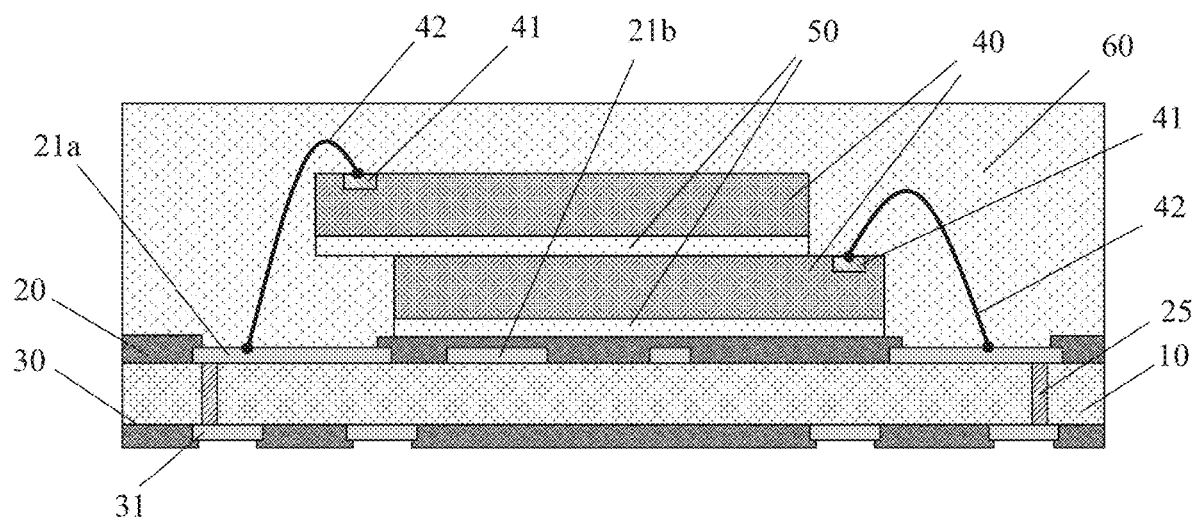

FIG. 2 illustrates a schematic view of a semiconductor structure with a plurality of semiconductor chips attached on the base substrate shown in FIG. 1. Referring to FIG. 2, a plurality of semiconductor chips 40 is then attached to the side of the first SR layer 20 of the base substrate. Each semiconductor chip 40 is attached to the base substrate using an adhesive layer 50. For illustrative purposes, shown in FIG. 2, two semiconductor chips 40 are stacked vertically on the base substrate with a certain displacement to ensure that chip-contact pads 41 disposed on the top surface of each semiconductor chip 40 are exposed for further wire bonding. However, based on actual needs, the number of the semiconductor chips 40 attached on the base substrate may be different from two, and the semiconductor chips 40 may be vertically stacked on each other and/or laterally spaced apart.

Each chip-contact pad 41 exposed on the top surface of the semiconductor chips 40 are then connected to a corresponding packaging pad 21a using a metal wire 42 by wire bonding. Further, an epoxy molding compound (EMC) layer 60 is used to seal the semiconductor chips 40 disposed above the first SR layer 20. The EMC layer 60 not only provides mechanical protection for the semiconductor structure but also prevents external moisture and dust from accessing the semiconductor chips 40, the packaging pads 21a, and the metal wires 42.

Figure 3:
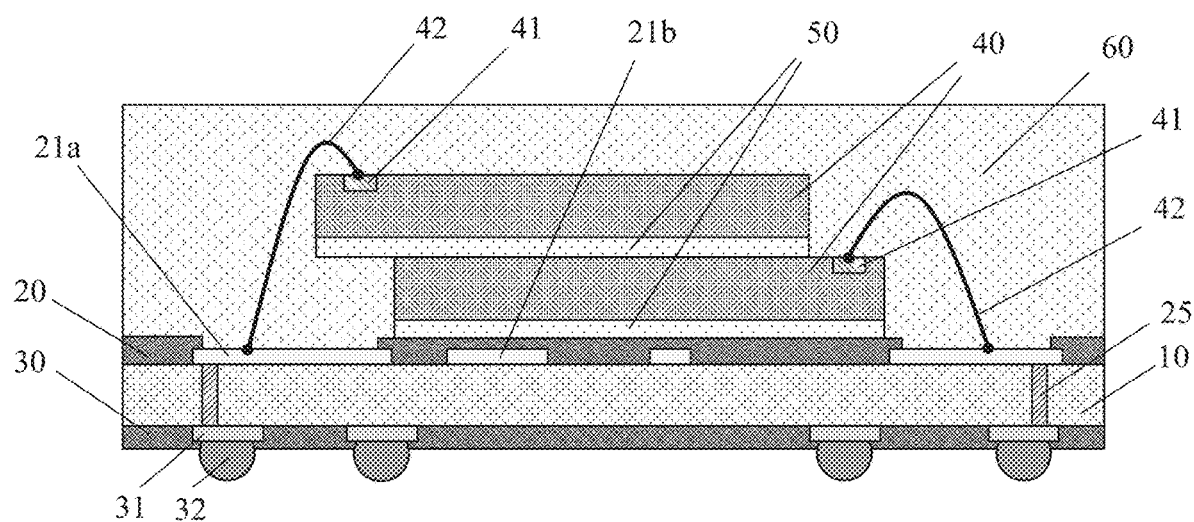

FIG. 3 illustrates a schematic view of a semiconductor package structure after a plurality of solder balls is planted on the solder pads of the semiconductor package structure shown in FIG. 2. Referring to FIG. 3, after the semiconductor chips 40 are attached and sealed, a plurality of solder balls 32 is planted on the plurality of solder pads 31 exposed by the second SR layer 30.

Figure 4:
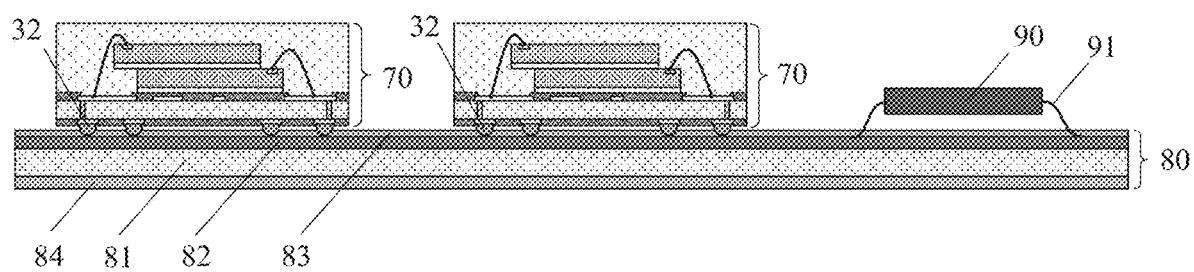

FIG. 4 illustrates a schematic view of a semiconductor structure after a plurality of device components is connected to a printed circuit board (PCB). Referring to FIG. 4, a PCB 80 including a core substrate 81, a conductive-line layer 82, a first solder resist (SR) layer 83, and a second SR layer 84 is provided. The conductive-line layer 82 includes a plurality of conductive lines (not shown) and a plurality of conductive pads (not shown). The plurality of device components includes at least one semiconductor package structure 70 obtained as described above. That is, each semiconductor package structure 70 shown in FIG. 4 is consistent with the structure shown in FIG. 3. The semiconductor package structure 70 is connected to the PCB 80 through the plurality of solder balls 32. The plurality of device components can also include other type of semiconductor structures. For example, as shown in FIG. 4, a resistor 90 is connected to the PCB 80 through two wires 91. Each wire 91 is connected to a corresponding conductive line in the conductive-line layer 82 of the PCB 80. As such, the plurality of device components is electrically connected to each other to form a semiconductor device.

According to the semiconductor device illustrated in FIG. 4, the semiconductor package structure has a cuboid shape with six surfaces, and the semiconductor package structure operates as a block box. For example, the components and devices inside the semiconductor package structure are invisible and unreachable, which raises challenges for operation test. Moreover, the electrical connections from each semiconductor package structure 70 to other device components all run through the bottom surface of the semiconductor package structure 70. With a given connection density allowed by the existing fabrication process, the area size of the bottom surface of the semiconductor package structure 70 needs to be large in order to accommodate all the electrical connections. Therefore, the wires connecting different components in the semiconductor package structure also need to be long. Such long connection wires often induce noise and cause signal loss, especially when the semiconductor device is operating at a high frequency. In addition, because all the electrical connections need to be designed in a same plane, the two-dimensional layout may not be in favor of the miniaturization of semiconductor devices. Also, with all the connection wires arranged in a single PCB, the fabrication of the semiconductor structure may become more complicated and the production cost may be more expensive.

Figure 11:
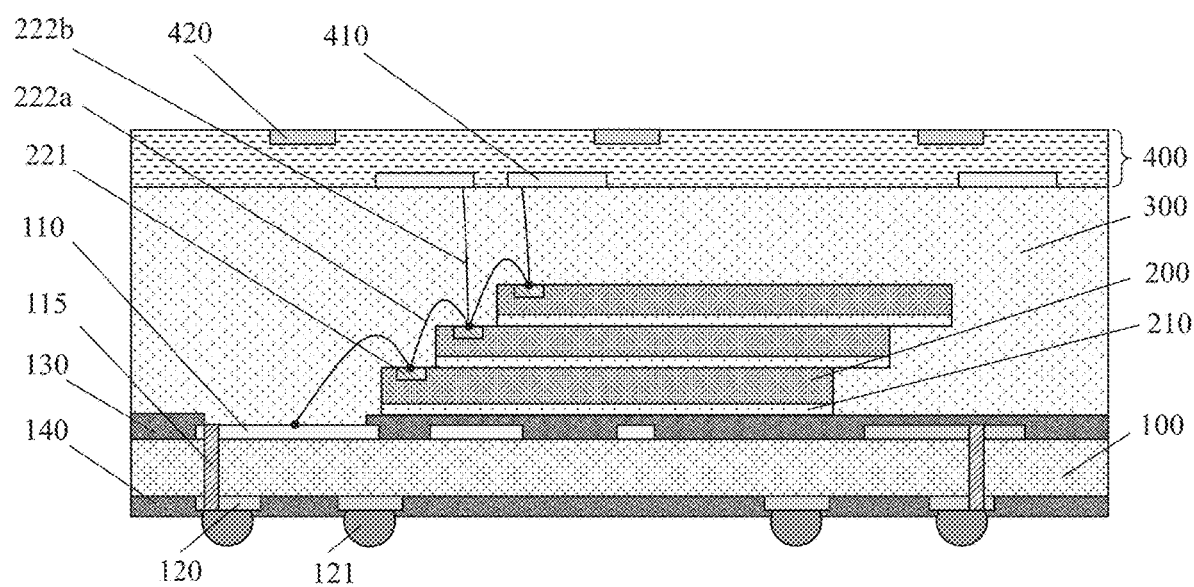
Figure 12:
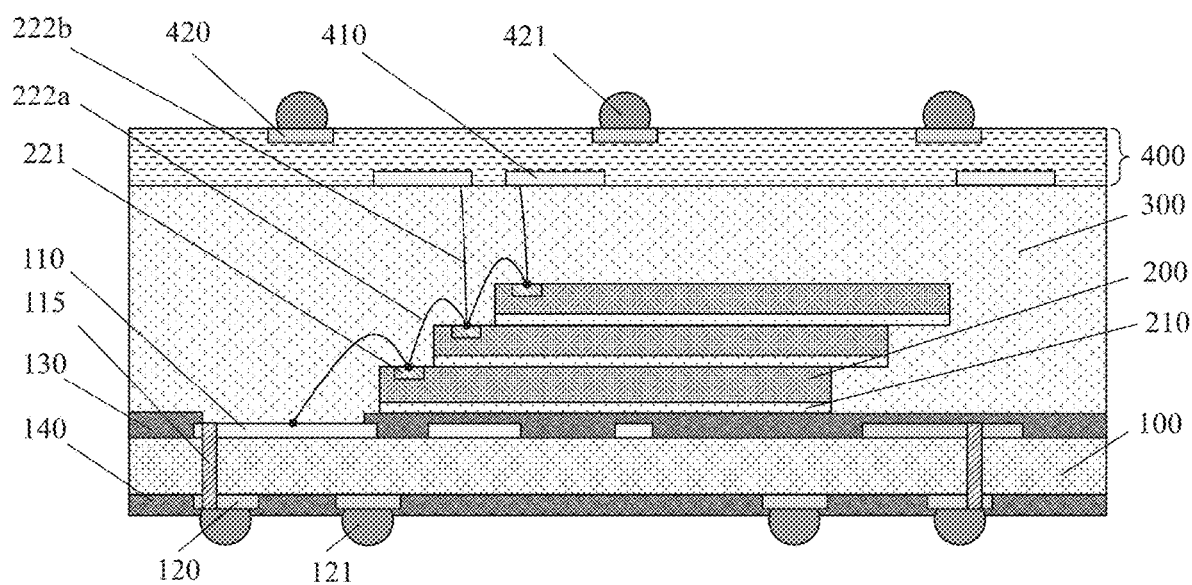
Figure 13:
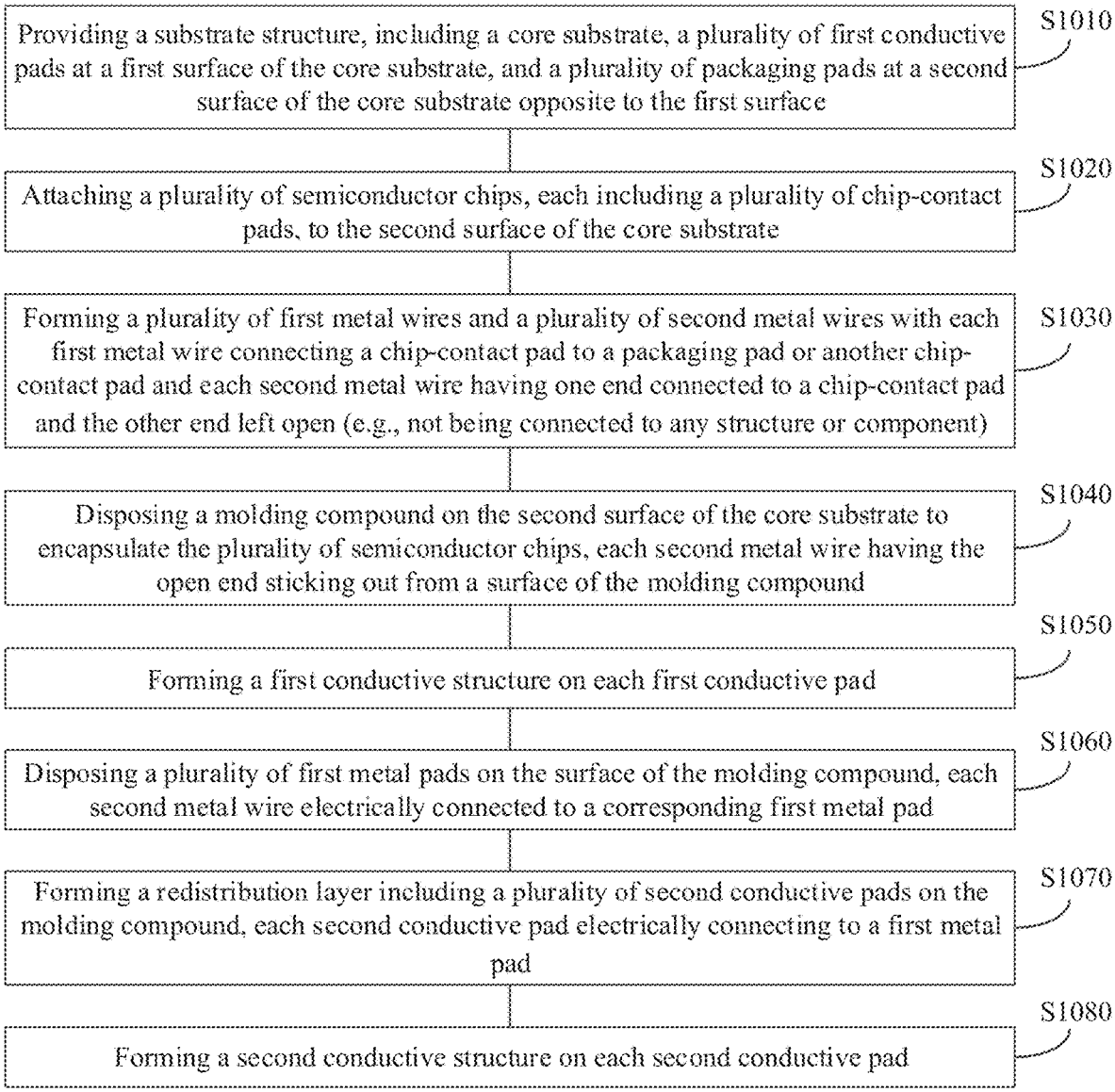
FIG. 13 illustrates a schematic flowchart of an exemplary packaging method according to various embodiments of the present disclosure.

The present disclosure provides a packaging method for forming a semiconductor package structure. FIG. 13 illustrates a schematic flowchart of an exemplary packaging method according to various embodiments of the present disclosure, and FIGS. 5-12 illustrate schematic views of semiconductor structures at certain stages of the exemplary packaging method.

Figure 5:
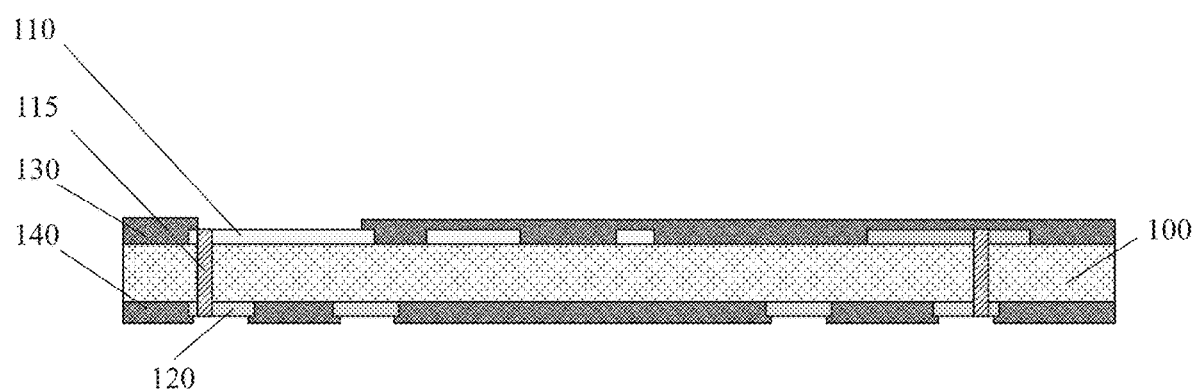
FIGS. 5-12 illustrate schematic views of semiconductor structures at certain stages of an exemplary packaging method according to various embodiments of the present disclosure.

Referring to FIG. 13, a substrate structure may be provided, the substrate structure including a core substrate, a plurality of first conductive pads at a first surface of the core substrate, and a plurality of packaging pads at a second surface of the core substrate opposite to the first surface (S1010). FIG. 5 illustrates a schematic cross-sectional view of a substrate structure consistent with various embodiments of the present disclosure.

Referring to FIG. 5, a substrate structure may be provided. The substrate structure may include a core substrate 100. The core substrate 100 may include a first surface (not labeled) and a second surface (not labeled) opposite to the first surface. The substrate structure may also include a plurality of first conductive pads 120 disposed on the first surface of the core substrate 100. The plurality of first conductive pads 120 may be made of a metal, such as copper, aluminum, tungsten, gold, or a combination thereof. The substrate structure may further include a first solder resist (SR) layer 140 formed on the first surface of the core substrate 100. The first SR layer may partially cover a portion of each first conductive pad 120.

The substrate structure may include a plurality of packaging pads 110 disposed on the second surface of the core substrate 100. The plurality of packaging pads 110 may be made of a metal, such as copper, aluminum, tungsten, gold, or a combination thereof. The substrate structure may also include a second SR layer 130 formed on the second surface of the core substrate 100. The second SR layer may partially cover each packaging pad 110.

The substrate structure may further include a plurality of conductive plugs 115 formed through the core substrate 100 and connecting a packaging pad 110 on the second surface of the core substrate 100 with a first conductive pad 120 on the first surface of the core substrate 100.

Figure 6:
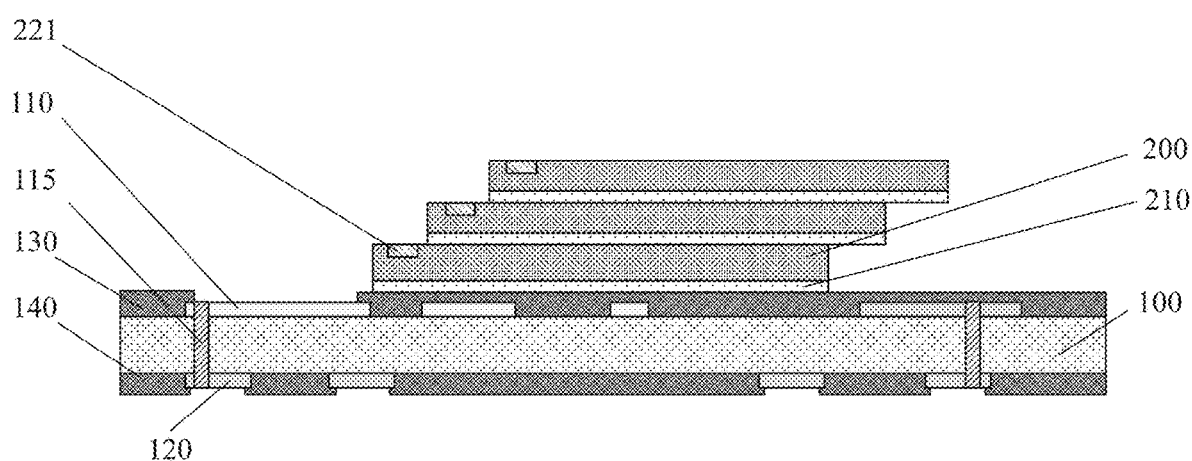

Further, returning to FIG. 13, a plurality of semiconductor chips, each including a plurality of chip-contact pads, may be attached to the second surface of the core substrate (S1020). FIG. 6 illustrates a schematic cross-sectional view of a semiconductor structure consistent with various embodiments of the present disclosure.

Referring to FIG. 6, a plurality of semiconductor chips 200 may be attached to the second surface of the core substrate 100. Each semiconductor chip 200 may be attached to the substrate structure using an adhesive layer 210. In addition, each semiconductor chip 200 may be provided with a plurality of chip-contact pads 221. For illustrative purposes, shown in FIG. 6, three semiconductor chips 200 are stacked vertically on the substrate structure with a certain displacement to ensure that chip-contact pads 221 disposed on the top surface of each semiconductor chip 200 are exposed for further wire bonding. However, based on actual needs, the number of the semiconductor chips 200 attached to the substrate structure may be different from three, and the semiconductor chips 200 may be vertically stacked on each other and/or laterally spaced apart.

Figure 7:
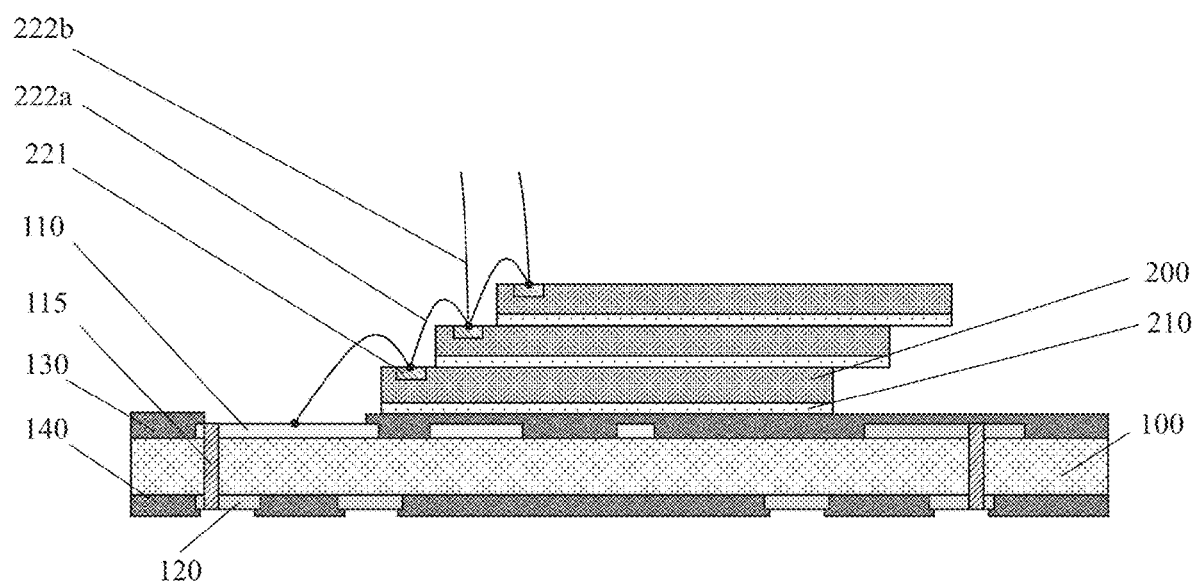

Further, returning to FIG. 13, a plurality of first metal wires and a plurality of second metal wires may be formed, each first metal wire may connect a chip-contact pad to a packaging pad or another chip-contact pad, and each second metal wire may have one end connected to a chip-contact pad and the other end left open (e.g., not being connected to any structure or component) (S1030). FIG. 7 illustrates a schematic cross-sectional view of a semiconductor structure consistent with various embodiments of the present disclosure.

Referring to FIG. 7, after attaching the plurality of semiconductor chips 200 onto the second surface of the core substrate 100, a plurality of first metal wires 222a and a plurality of second metal wires 222b may be connected to the plurality of chip-contact pads 221 disposed on the plurality of semiconductor chips 200. One end of each first metal wire 222a may be connected to a chip-contact pad 221, and the other end of the first metal wire 222a may be connected to another chip-contact pad 221 or a packaging pad 110. One end of each second metal wire 222b may be connected to a chip-contact pad 221, and the other end of the second metal wire 222b may be an open end (e.g., an end that is not connected to any other component or device). That is, one of the two ends of each second metal wire 222b may not be connected to any component or structure. Each second metal wire 222b may extend substantially in a direction perpendicular to the substrate structure, such that after forming a molding compound to encapsulate the plurality of semiconductor chips 200, the plurality of first metal wires 222a, and the plurality of second metal wires 222b, each second metal wire 222b may stick out from the top surface of the molding compound.

In one embodiment, the plurality of first metal wires 222a and the plurality of second metal wires 222b may be connected to the corresponding pads through a wire bonding process. The wire bonding process for forming the plurality of second metal wires 222b may be a vertical wire bonding process. It should be noted that for a chip-contact pad 221, connecting the chip-contact pad 221 to a first metal wire 222a and connecting the chip-contact pad 221 to a second metal wire 222b do not necessarily repel each other. That is, in some examples, a chip-contact pad 221 may be connected not only to a first metal wire 222a but also to a second metal wire 222b. In other embodiments, the plurality of second metal wires 222b may be formed by an electro-plating process. For example, the plurality of second metal wires 222b may be vertical copper pillars and may be formed through an electro-plating process. Compared with using gold to form the plurality of second metal wires through a wire bonding process, using copper to form plurality of the second metal wires through an electro-plating process may be able to reduce the production cost.

Figure 8:
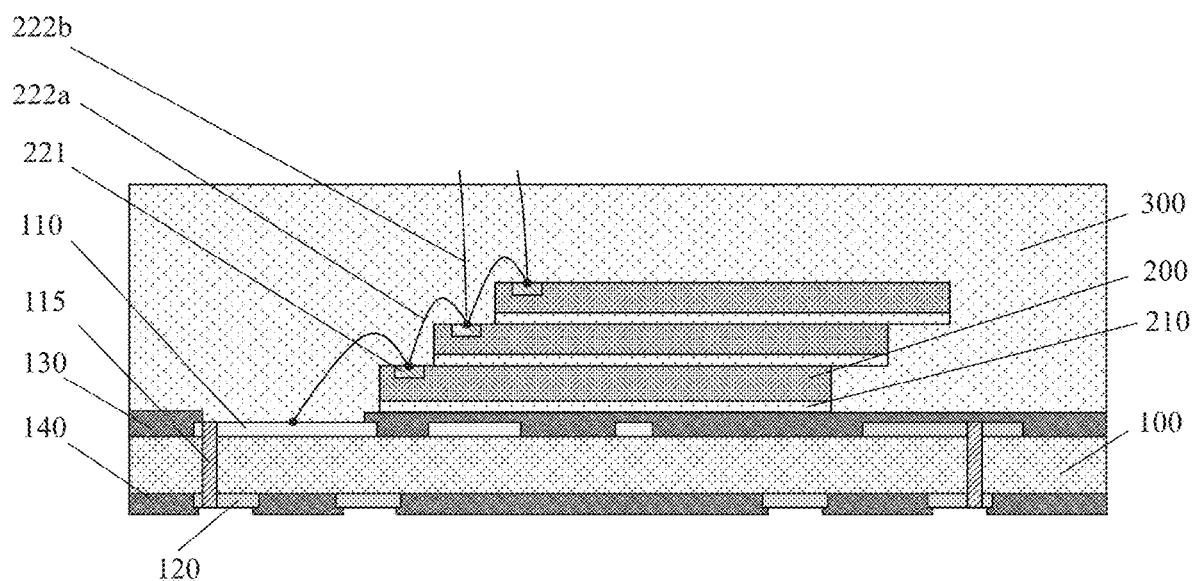

Further, returning to FIG. 13, a molding compound may be disposed on the second surface of the core substrate to encapsulate the plurality of semiconductor chips, and each second metal wire may have the open end sticking out from a surface of the molding compound (S1040). FIG. 8 illustrates a schematic cross-sectional view of a semiconductor structure consistent with various embodiments of the present disclosure.

Referring to FIG. 8, after connecting the plurality of first metal wires 222a and the plurality of second metal wires 222b to the plurality of chip-contact pads 221, a molding compound 300 may be disposed on the second surface of the core substrate 100 to encapsulate the plurality of semiconductor chips 200 and the plurality of first metal wires 222a. In one embodiment, the molding compound 300 may be made of an epoxy.

In one embodiment, the molding compound 300 may cover the plurality of packaging pads 110 and the second SR layer 130. The molding compound 300 may substantially cover each second metal wire 222b with the open end of the second metal wire 222b sticking out from a surface of the molding compound 300. The molding compound 300 may not only provide mechanical protection for the encapsulated components and structures but also prevent external moisture and dust from accessing the semiconductor chips 200, the packaging pads 110, the first metal wires 222a, and the second metal wires 222b.

In some embodiments, the plurality of second metal wires may not be formed when forming the plurality of first metal wires to connect the chip-contact pads to corresponding packaging pads. Instead, after forming the molding compound to encapsulate the plurality of semiconductor chips and the plurality of first metal wires, a plurality of holes may be formed in the molding compound to expose chip-contact pads that need to be connected to the top surface of the molding compound. Further, a metal pillar or a metal plug may be formed to fill each hole such that after forming a second conductive pad on the exposed top surface of the metal pillar or the metal plug, the corresponding chip-contact pad may be electrically connected to the second conductive pad. To reduce the production cost, the metal pillar or the metal plug may be made of copper.

Figure 9:
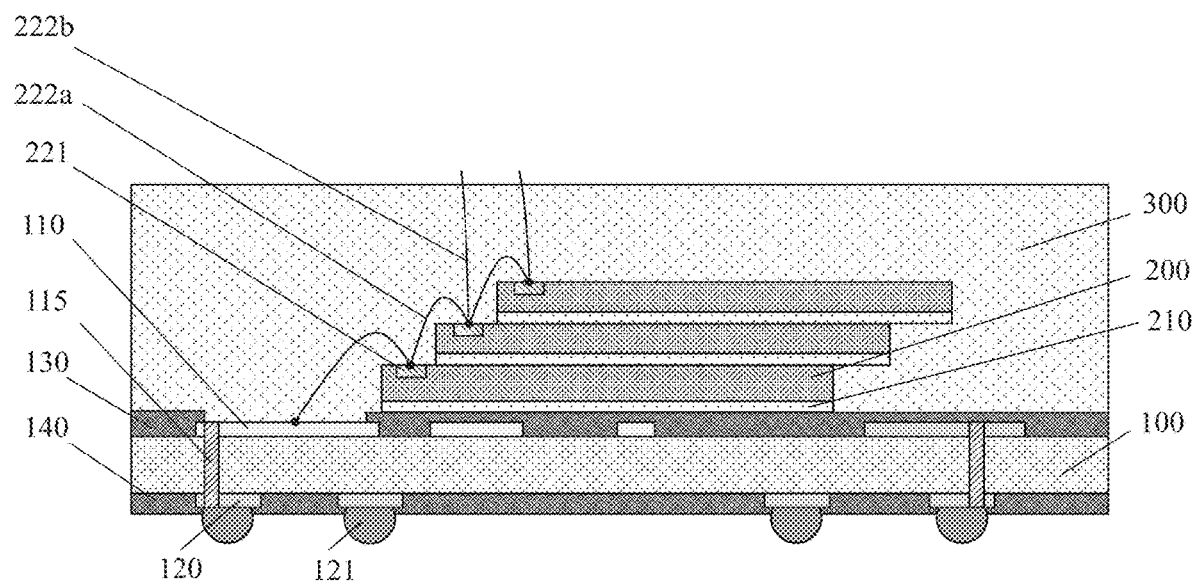

Further, returning to FIG. 13, after forming the molding compound to encapsulate the plurality of semiconductor chips onto the second surface of the core substrate, a first conductive structure may be formed on each first conductive pad (S1050). FIG. 9 illustrates a schematic cross-sectional view of a semiconductor structure consistent with various embodiments of the present disclosure.

Referring to FIG. 9, after forming the molding compound 300 to encapsulate the plurality of semiconductor chips 200 on to the second surface of the core substrate 100, a first conductive structure 121 may be formed on each first conductive pad 120. It should be noted that in one embodiment, the method is described to have a solder ball formed on each first conductive pad 120, and the plurality of solder balls may serve as electrical connectors between the semiconductor package structure and a first PCB. However, according to actual needs, conductive pillars or conductive bumps may be alternative structures for providing electrical connections between the semiconductor package structure and the first PCB. Therefore, in the present disclosure, solder balls, conductive pillars, conductive bumps, etc. formed on the substrate structure for providing electrical connections to a first PCB may all be referred to as first conductive structures 121.

Figure 10:
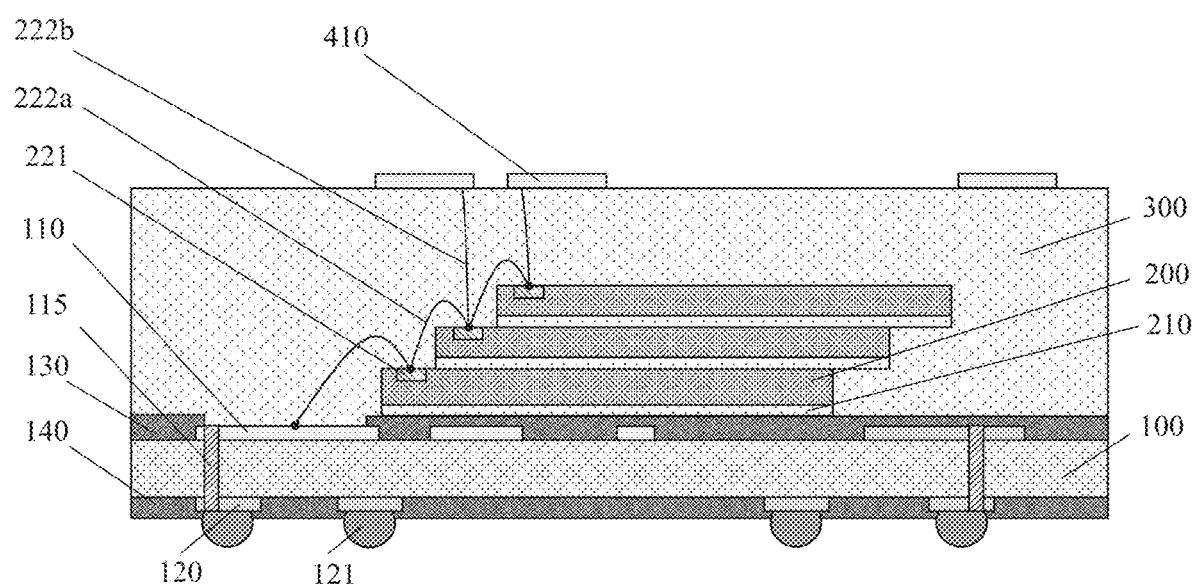

Further, returning to FIG. 13, a plurality of first metal pads may be disposed on the surface of the molding compound, and each second metal wire is electrically connected to a corresponding first metal pad (S1060). FIG. 10 illustrates a schematic cross-sectional view of a semiconductor structure consistent with various embodiments of the present disclosure.

Referring to FIG. 10, a plurality of first metal pads 410 may be disposed on the surface of the molding compound 300, such that the open end of each second metal wire 222b may be electrically connected to a corresponding first metal pad 410.

In one embodiment, prior to forming the plurality of first metal pads 410, the portion of each second metal wire 222b sticking out from the molding compound 300 may be removed, such that the contact point between the second metal wire 222b and the corresponding first metal pad 410 may be the end point of the trimmed second metal wire 222b exposed at the surface of the molding compound 300. In other embodiments, the portion of each second metal wire sticking out from the molding compound may be retained, such that the entire portion of the second metal wire sticking out from the molding compound may be in contact with the corresponding first metal pad.

Further, returning to FIG. 13, a redistribution layer including a plurality of second conductive pads may be formed on the molding compound to electrically connect with the plurality of first metal pads (S1070). FIG. 11 illustrates a schematic cross-sectional view of a semiconductor structure consistent with various embodiments of the present disclosure.

Referring to FIG. 11, a redistribution layer 400 may be formed on the molding compound 300. The redistribution layer 400 may include a plurality of second conductive pads 420, and each first metal pad 410 may be electrically connected to a corresponding second conductive pad 420. As such, the second conductive pad 420 may be electrically connected to a chip-contact pad 221 through the first metal pad 410 and the second metal wire 222b connected to the first metal pad 410. The redistribution layer 400 may be formed by any appropriate method for fabricating redistribution layer according to existing technology.

Further, returning to FIG. 13, a second conductive structure may be formed on each second conductive pad (S1080). FIG. 12 illustrates a schematic cross-sectional view of a semiconductor structure consistent with various embodiments of the present disclosure.

Referring to FIG. 12, after forming the redistribution layer 400, a second conductive structure 421 may be formed on each second conductive pad 420. It should be noted that in one embodiment, the method is described to have a solder ball formed on each second conductive pad 420, and the plurality of solder balls may serve as electrical connectors between the semiconductor package structure and a second PCB. However, according to actual needs, conductive pillars or conductive bumps may be alternative structures for providing electrical connections between the semiconductor package structure and the second PCB. Therefore, in the present disclosure, solder balls, conductive pillars, conductive bumps, etc. formed on the substrate structure for providing electrical connections to a second PCB may all be referred to as second conductive structures 420.

Figure 14:
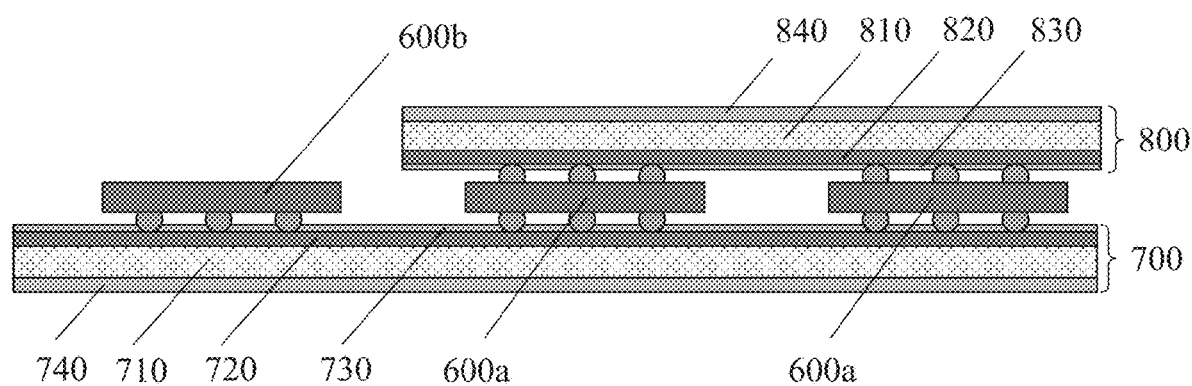
FIG. 14 illustrates a schematic view of a semiconductor structure obtained after at least one exemplary semiconductor package structure is connected to two print circuit boards.

FIG. 14 illustrates a schematic view of a semiconductor structure obtained after at least one exemplary semiconductor package structure (e.g., first semiconductor package structure) is connected to two print circuit boards. Referring to FIG. 14, a plurality of first semiconductor package structures 600a consistent with various embodiments described above may be connected to a first PCB 700 and a second PCB 800. For illustrative purposes, the first PCB 700 and the second PCB 800 are described as a bottom PCB and a top bottom PCB, respectively.

In one embodiment, the first PCB 700 may include a first substrate 710, a first circuit layer 720 and a third SR layer 730 formed on a first surface of the first substrate 710, and a first protective layer 740 formed on a second surface of the first substrate 710 opposite to the first surface. The second PCB 800 may include a second substrate 810, a second circuit layer 820 and a fourth SR layer 830 formed on a first surface of the second substrate 810, and a second protective layer 840 formed on a second surface of the second substrate 810 opposite to the first surface. For each first semiconductor package structure 600a, a plurality of first conductive structures 121 (for example, a plurality of first solder balls) formed on a surface of the first semiconductor package structure 600a may be electrically connected to the first circuit layer 720, and a plurality of second conductive structures 421 (for example, a plurality of second solder balls) formed on another surface of the first semiconductor package structure 600a may be electrically connected to the first circuit layer 720. It should be noted that the definitions of "first PCB" and "second PCB" are merely used to distinguish the two PCBs, and in actual applications, the second PCB may be connected to the plurality of conductive structures formed on the surface of the substrate structure and the first PCB may be connected to the plurality of conductive structures formed on the surface of the molding compound. In addition, although each first semiconductor package structure 600a is consistent with the semiconductor package structure shown in FIG. 12, the view of the first semiconductor package structure 600a shown in FIG. 14 may correspond to a flipped view of the semiconductor package structure shown in FIG. 12.

Moreover, the semiconductor structure shown in FIG. 14 may also include a plurality of second semiconductor package structures 600b connected to one of the two PCBs. Each second semiconductor package structure 600b may be provided with conductive structures on only one of the six surfaces. That is, the arrangement of conductive structures on the second semiconductor package structure 600b may be consistent with the arrangement of conductive structures on existing semiconductor package structures. In addition, other electronic components, such as resistors, capacitors, inductors, etc. may also be directly connected to one of the two PCBs to ensure that the semiconductor structure can implement designed functions.

According to the packaging method described above, a semiconductor package structure may be obtained. The semiconductor package structure is provided with solder balls on both the top and the bottom surfaces of the semiconductor package structure. Compared to existing method for forming semiconductor package structures, the disclosed method allows solder balls to be arranged on more than one of the six surfaces of the formed semiconductor package structure, such that the semiconductor package structure can be connected to at least two PCBs from different directions. For example, the semiconductor package structure can be connected to two PCBs from the top surface and the bottom surface, respectively, thereby improving the utilization of space. Also, compared to the wires in existing semiconductor package structures, the wires connecting different components in the disclosed semiconductor package structure can be effectively shortened. As such, parasitic resistance, capacitance, and inductance may be substantially reduced, which may further improve the high-frequency performance of the semiconductor package structure. In addition, because the semiconductor package structure can exchange electrical signals with more than one PCB, each PCB may also be made smaller. Therefore, not only the wires in the circuit layer of the PCB may be shortened, but the fabrication process of the PCB may be simplified.

Accordingly, the present disclosure also provides a semiconductor package structure formed by the disclosed packaging method. FIG. 12 illustrates a schematic cross-sectional view of an exemplary semiconductor package structure according to various embodiments of the present disclosure.

Referring to FIG. 12, the semiconductor package structure may include a substrate structure. The substrate structure may include a core substrate 100. The core substrate 100 may include a first surface (not labeled) and a second surface (not labeled) opposite to the first surface. The substrate structure may also include a plurality of first conductive pads 120 disposed on the first surface of the core substrate 100. The plurality of first conductive pads 120 may be made of a metal, such as copper, aluminum, tungsten, gold, or a combination thereof. The substrate structure may further include a first SR layer 140 formed on the first surface of the core substrate 100. The first SR layer may partially cover a portion of each first conductive pad 120.

The substrate structure may include a plurality of packaging pads 110 disposed on the second surface of the core substrate 100. The plurality of packaging pads 110 may be made of a metal, such as copper, aluminum, tungsten, gold, or a combination thereof. The substrate structure may also include a second SR layer 130 formed on the second surface of the core substrate 100. The second SR layer may partially cover each packaging pad 110.

The substrate structure may further include a plurality of conductive plugs 115 formed through the core substrate 100 and connecting a packaging pad 110 on the second surface of the core substrate 100 with a first conductive pad 120 on the first surface of the core substrate 100.

The semiconductor package structure may include a first conductive structure 121 formed on each first conductive pad 120. It should be noted that in one embodiment, the semiconductor package structure is described to have a solder ball formed on each first conductive pad 120, and the plurality of solder balls may serve as electrical connectors between the semiconductor package structure and a first PCB. However, according to actual needs, conductive pillars or conductive bumps may be alternative structures for providing electrical connections between the semiconductor package structure and the first PCB. Therefore, in the present disclosure, solder balls, conductive pillars, conductive bumps, etc. formed on the substrate structure for providing electrical connections to a first PCB may all be referred to as first conductive structures 121.

The semiconductor package structure may include a plurality of semiconductor chips 200 attached to the second surface of the core substrate 100. Each semiconductor chip 200 may be attached to the substrate structure using an adhesive layer 210. In addition, each semiconductor chip 200 may be provided with a plurality of chip-contact pads 221. For illustrative purposes, shown in FIG. 12, three semiconductor chips 200 are stacked vertically on the substrate structure with a certain displacement to ensure that chip-contact pads 221 disposed on the top surface of each semiconductor chip 200 are exposed for further wire bonding. However, based on actual needs, the number of the semiconductor chips 200 attached to the substrate structure may be different from three, and the semiconductor chips 200 may be vertically stacked on each other and/or laterally spaced apart.

The semiconductor package structure may include a plurality of first metal wires 222a and a plurality of second metal wires 222b connected to the plurality of chip-contact pads 221 disposed on the plurality of semiconductor chips 200, and a molding compound 300 disposed on the second surface of the core substrate 100. The molding compound 300 may encapsulate the plurality of semiconductor chips 200, the plurality of first metal wires 222a, and the plurality of second metal wires 222b. The molding compound 300 may not only provide mechanical protection for the encapsulated components and structures but also prevent external moisture and dust from accessing the semiconductor chips 200, the packaging pads 110, the first metal wires 222a, and the second metal wires 222b.

The semiconductor package structure may further include a plurality of first metal pads 410 disposed on the surface of the molding compound 300. In one embodiment, one end of each first metal wire 222a may be connected to a chip-contact pad 221, and the other end of the first metal wire 222a may be connected to another chip-contact pad 221 or a packaging pad 110. One end of each second metal wire 222b may be connected to a chip-contact pad 221, and the other end of the second metal wire 222b may be connected to a first metal pad 410.

The semiconductor package structure may include a redistribution layer 400 formed on the molding compound 300. The redistribution layer 400 may include a plurality of second conductive pads 420, and each first metal pad 410 may be electrically connected to a corresponding second conductive pad 420. As such, the second conductive pad 420 may be electrically connected to a chip-contact pad 221 through the first metal pad 410 and the second metal wire 222b connected to the first metal pad 410.

Further, the semiconductor package structure may also include a second conductive structure 421 formed on each second conductive pad 420. It should be noted that in one embodiment, the semiconductor package structure is described to have a solder ball formed on each second conductive pad 420, and the plurality of solder balls may serve as electrical connectors between the semiconductor package structure and a second PCB. However, according to actual needs, conductive pillars or conductive bumps may be alternative structures for providing electrical connections between the semiconductor package structure and the second PCB. Therefore, in the present disclosure, solder balls, conductive pillars, conductive bumps, etc. formed on the substrate structure for providing electrical connections to a second PCB may all be referred to as second conductive structures 421.

According to the disclosed semiconductor package structure, solder balls are formed on both the top and the bottom surfaces of the semiconductor package structure. Therefore, the semiconductor package structure can be connected to at least two PCBs from different directions. For example, the semiconductor package structure can be connected to two PCBs from the top surface and the bottom surface, respectively, thereby improving the utilization of space. Also, compared to the wires in existing semiconductor package structures, the wires in the disclosed semiconductor package structure that are used to connect with different components can be effectively shortened. As such, parasitic resistance, capacitance, and inductance may be substantially reduced, which may further improve the high-frequency performance of the semiconductor package structure. In addition, because the semiconductor package structure can exchange electrical signals with more than one PCB, each PCB may also be made smaller. Therefore, not only the wires in the circuit layer of the PCB may be shortened, but the fabrication process of the PCB may be simplified.

Figure 15:
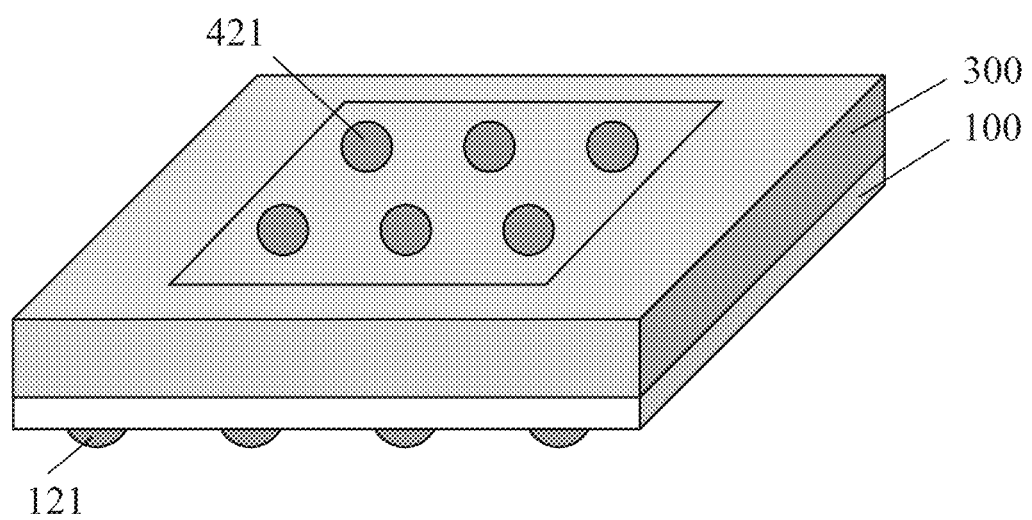
FIG. 15 illustrates a schematic view of an exemplary semiconductor package structure according to various embodiments of the present disclosure.

FIG. 15 illustrates a schematic three-dimensional view of an exemplary semiconductor package structure according to various embodiments of the present disclosure. It should be noted that for illustrative purposes, FIG. 15 only shows a core substrate 100, a molding compound 300 disposed over the core substrate 100, a plurality of first conductive structures 121 disposed on the surface of the core substrate 100 away from the molding compound 300, and a plurality of second conductive structures 421 disposed on the surface of the molding compound 300 away from the core substrate 100. In actual applications, the semiconductor package structure may also include various components described in the embodiments provided above. Referring to FIG. 15, in one embodiment, each second conductive structure 421 disposed on the molding compound 300 may be a solder ball. The solder ball (e.g., the second conductive structure 421) may be formed on a corresponding second conductive pad 420 (referring to FIG. 11).

Figure 16:
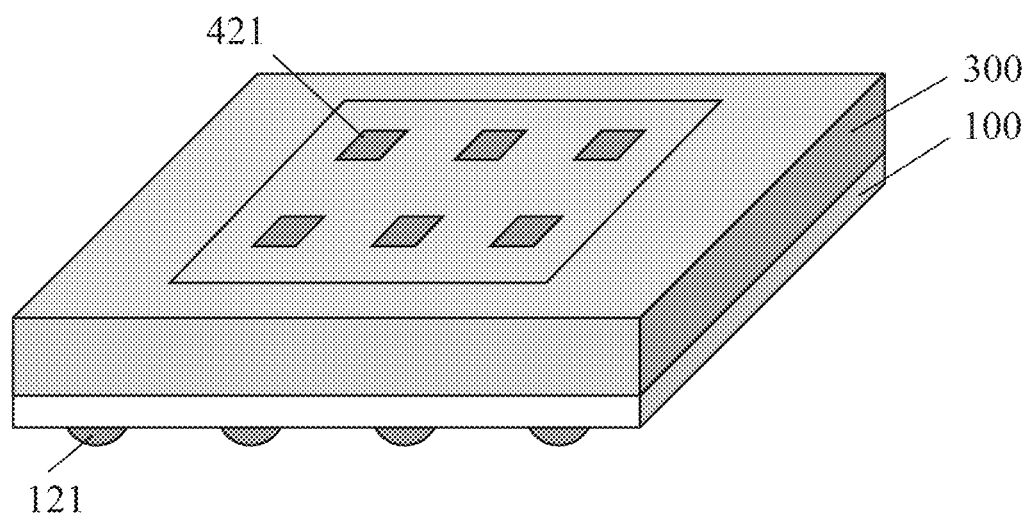
FIG. 16 illustrates a schematic view of another exemplary semiconductor package structure according to various embodiments of the present disclosure.

FIG. 16 illustrates a schematic three-dimensional view of another exemplary semiconductor package structure according to various embodiments of the present disclosure. Referring to FIG. 16 and FIG. 15, the semiconductor package structure shown in FIG. 16 may be substantially the same as that shown in FIG. 15, and the only difference is that in FIG. 16, instead of a solder ball, each second conductive structure 421 disposed on the molding compound 300 may be a metallic contact pad. In one embodiment, the metallic contact pad may be a second conductive pad 420 (referring to FIG. 11) formed in the redistributed layer 400. Alternatively, the metallic contact pad (e.g., the second conductive structure 421) may be a metal pillar or a metal bump formed on a second conductive pad 420 (referring to FIG. 11), such that the metallic contact pad (e.g., the second conductive structure 421) may protrude from the surface of the redistribution layer 400.

Figure 17:
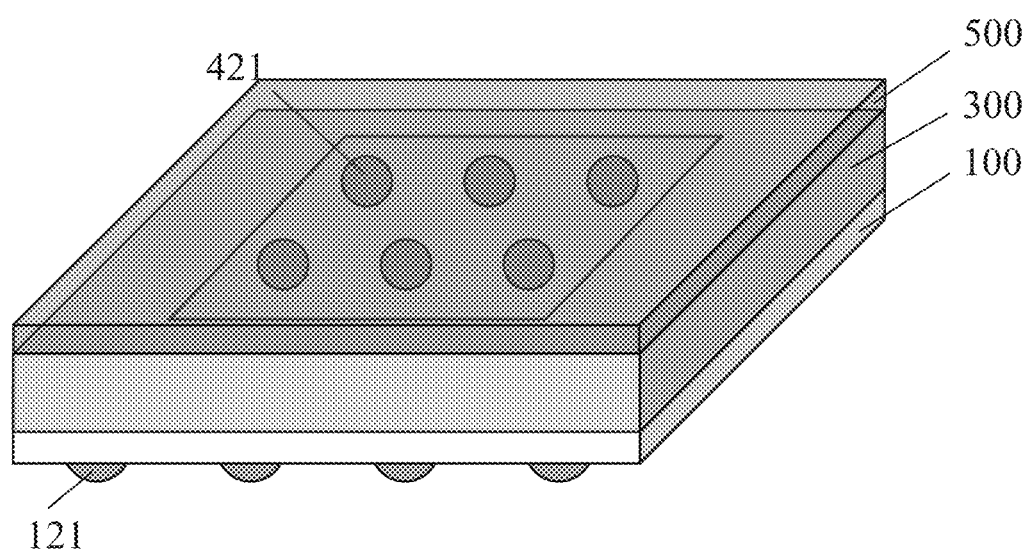
FIG. 17 illustrates a schematic view of another exemplary semiconductor package structure according to various embodiments of the present disclosure.

FIG. 17 illustrates a schematic three-dimensional view of another exemplary semiconductor package structure according to various embodiments of the present disclosure. Referring to FIG. 17, in one embodiment, the plurality of second conductive structures 421 may be covered by a third protective layer 500. The third protective layer 500 may provide protection for the semiconductor package structure during storage or transport, and may be removed when the plurality of second conductive structures 421 needs to be connected to a testing platform or a PCB for testing or operation. In one embodiment, the third protective layer 500 may be made of a temporal-bonding material, and the third protective layer 500 may be de-bonded and removed after applying laser, heat, etc.

It should be noted that each second conductive structure disposed on the molding compound may be a conductive structure of any appropriate type, including solder ball, metal pillar, metal bump, electric socket, etc., and those skilled in the art may choose a proper type for each second conductive structure according to actual needs.

Figure 18:
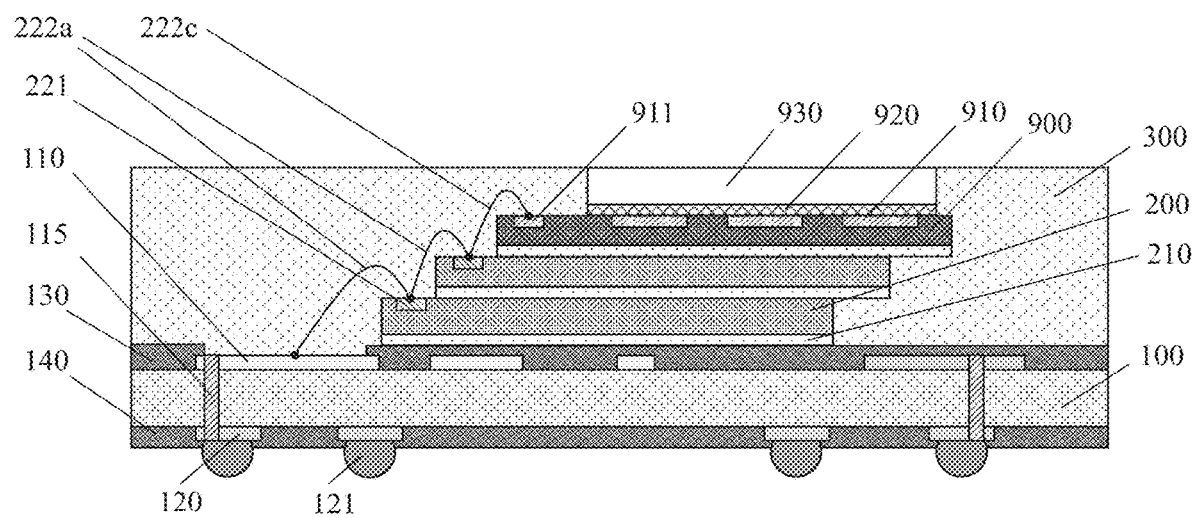
FIG. 18 illustrates a schematic cross-sectional view of another exemplary packaging method according to various embodiments of the present disclosure.

FIG. 18 illustrates a schematic cross-sectional view of another exemplary packaging method according to various embodiments of the present disclosure. The semiconductor package structure shown in FIG. 18 may be substantially the same as the semiconductor package structure shown in FIG. 12, and the following description will be focused on the differences between the two semiconductor package structures.

Different from the semiconductor packaging structure shown in FIG. 12 where a plurality of first metal pads 410 is used to electrically connect with a plurality of chip-contact pads 221, the semiconductor package structure shown in FIG. 18 may include an interpolation substrate 900 disposed on a semiconductor chip 200 to electrically connect with a plurality of chip-contact pads 221. The interpolation substrate 900 may be attached to a top surface of a semiconductor chip 200 using an adhesive layer 210. The interpolation substrate 900 may include a plurality of substrate-contact pads 911 and a plurality of third conductive pads 910. Each substrate-contact pad 911 may be electrically connected to a chip-contact pad 221 using a third metal wire 222c. The substrate-contact pad 911 may also be connected to a corresponding third conductive pad 910. As such, a portion of the chip-contact pads 221 may be electrically connected to the interpolation substrate 900.

Further, the molding compound 300 disposed on the second surface of the core substrate 100 may also partially cover the interpolation substrate 900. For example, the plurality of substrate-contact pads 911 together with the corresponding third metal wires 222c may be encapsulated by the molding compound 300, and the plurality of third conductive pads 910 may be uncovered by the molding compound 300. In one embodiment, in a direction from the core substrate 100 to the top surface of the molding compound 300, a portion of the molding compound 300 may exceed the top surface of the interpolation substrate 900. The semiconductor package structure may include a fourth protective layer 920 disposed on the interpolation substrate 900. The fourth protective layer 920 may cover the plurality of third conductive pads 910. Further, the semiconductor package structure may also include a cover plate 930 disposed on the fourth protective layer 920. In one embodiment, the top surface of the molding compound 300 may be leveled with the top surface of the cover plate 930.

The fourth protective layer 920 may be made of a material that can be de-bonded and removed after applying laser, heat, etc. For example, the fourth protective layer 920 may be made of a material that becomes removable after being irradiated by laser beams. In one embodiment, the cover plate 930 may be made of glass or any other appropriate transparent material to allow laser beams to penetrate through, and the cover plate 930 may be removable.

Accordingly, the present disclosure provides a packaging method for forming the semiconductor package structure described above. The packaging method may be substantially the same as the packaging method described above for forming a semiconductor package structure with a plurality of second conductive structures 421 (referring to FIG. 12) disposed on the top of the molding compound. The following description of the packaging method for forming the semiconductor package structure shown in FIG. 18 will be focused on the differences between the two packaging methods.

After packaging a plurality of semiconductor chips 200 onto the second surface of the core substrate 100, an interpolation substrate 900 may be attached onto an exposed top surface of a semiconductor chip 200. The interpolation substrate 900 may include a plurality of substrate-contact pads 911 and a plurality of third conductive pads 910. Further, each substrate-contact pad 911 may be electrically connected to a chip-contact pad 221 using a third metal wire 222c. The substrate-contact pad 911 may also be connected to a corresponding third conductive pad 910. As such, a portion of the chip-contact pads 221 may be electrically connected to the interpolation substrate 900.

Further, a molding compound 300 may be disposed on the second surface of the core substrate 100 may also partially cover the interpolation substrate 900. For example, the plurality of substrate-contact pads 911 together with the corresponding third metal wires 222c may be encapsulated by the molding compound 300, and the plurality of third conductive pads 910 may be uncovered by the molding compound 300. In one embodiment, in a direction from the core substrate 100 to the top surface of the molding compound 300, a portion of the molding compound 300 may exceed the top surface of the interpolation substrate 900. A fourth protective layer 920 may be then disposed on the interpolation substrate 900 to cover the plurality of third conductive pads 910. Further, a cover plate 930 may be disposed on the fourth protective layer 920. In one embodiment, the top surface of the molding compound 300 may be leveled with the top surface of the cover plate 930.

The fourth protective layer 920 may be made of a material that can be de-bonded and removed after applying laser, heat, etc. For example, the fourth protective layer 920 may be made of a material that becomes removable after being irradiated by laser beams. In one embodiment, the cover plate 930 may be made of glass or any other appropriate transparent material to allow laser beams to penetrate through, and the cover plate 930 may be removable.

According to the disclosed semiconductor packaging structure and packaging method, conductive structures are formed on both the top and the bottom surfaces of the semiconductor package structure. Therefore, the semiconductor package structure can be connected to at least two PCBs from different directions. For example, the semiconductor package structure can be connected to two PCBs from the top surface and the bottom surface, respectively, thereby improving the utilization of space. Also, compared to the wires in existing semiconductor package structures, the wires in the disclosed semiconductor package structure that are used to connect with different components can be effectively shortened. As such, parasitic resistance, capacitance, and inductance may be substantially reduced, which may further improve the high-frequency performance of the semiconductor package structure. In addition, because the semiconductor package structure can exchange electrical signals with more than one PCB, each PCB may also be made smaller. Therefore, not only the wires in the circuit layer of the PCB may be shortened, but the fabrication process of the PCB may be simplified.

Figure 19:
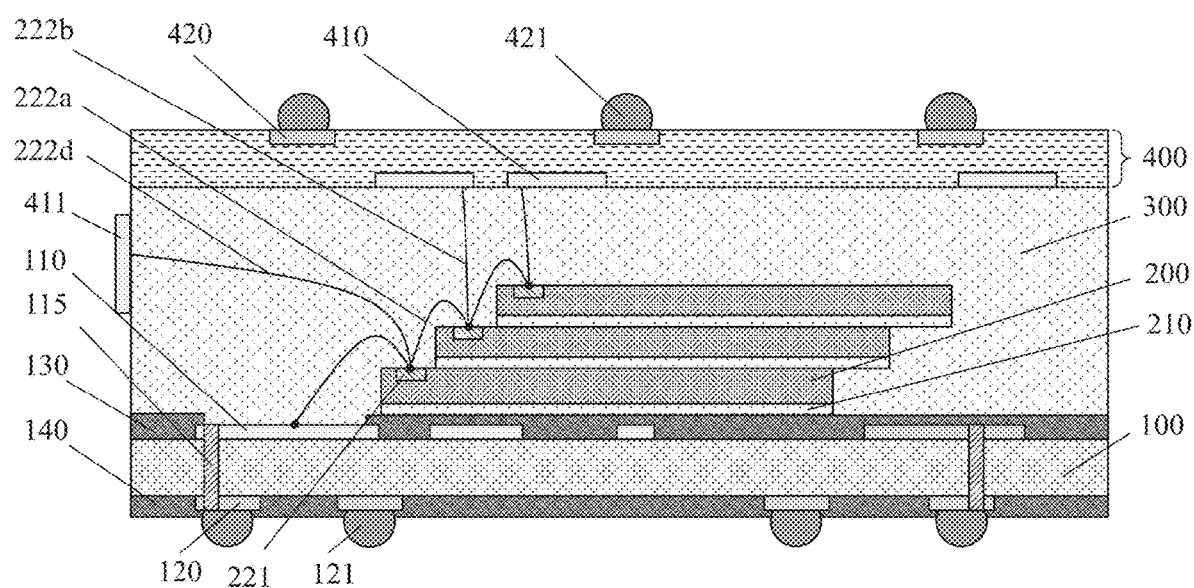
FIG. 19 illustrates a schematic cross-sectional view of another exemplary packaging method according to various embodiments of the present disclosure.

In the embodiments provided above, the plurality of second conductive structures is described to be formed on the top surface of the molding compound (for example, referring to FIG. 12). However, it should be noted that the plurality of second conductive structures may be formed on any surface of the semiconductor package structure. FIG. 19 illustrates a schematic cross-sectional view of another exemplary packaging method according to various embodiments of the present disclosure. Different from the semiconductor package structure shown in FIG. 12 where a plurality of second conductive structures 421 is formed on the top surface of the molding compound 300, the semiconductor package structure shown in FIG. 19 may include a fourth metal wire 222d encapsulated by the molding compound 300 and electrically connected to a chip-contact pad 221, and a first metal pad 410 formed on a side surface of the molding compound 300 and electrically connected to the fourth metal wire 222d. In one embodiment, the first metal pad 410 formed on the side surface of the molding compound 300 may be a conductive structure that can be connected to a PCB or any other appropriate substrate. In other embodiments, a conductive structure may be further formed on the first metal pad 410 to provide an electrical connector to a PCB or any other appropriate substrate.

Accordingly, when forming the semiconductor package structure shown in FIG. 19, the method may include forming a fourth metal wire 222d to electrically connect with a chip-contact pad 221 prior to forming the molding compound 300. The fourth metal wire 222d may extend substantially in a direction parallel to the substrate structure, such that after forming the molding compound 300, the fourth metal wire 222d may stick out from a side surface of the molding compound 300 (e.g., a surface of the molding compound 300 that is perpendicular to the base substrate).

Further, after forming the molding compound 300, a second metal pad 411 may be formed on the side surface of the molding compound 300 to electrically connect with the fourth metal wire 222d. In one embodiment, the second metal pad 411 may directly serve as a connection structure, such that a PCB, a device, or a component can be connected to the semiconductor package structure through the second metal pad 411. In other embodiments, a redistribution layer and/or a conductive structure may be further formed on the second metal pad to provide an electrical connection for a PCB, a device, or a component.

It should be noted that in one embodiment, the semiconductor package structure may include a plurality of second metal wires 222b and a plurality of fourth metal wires 222d to connect a portion of the chip-contact pads 221 to two or more surfaces of the molding compound 300. As such, the semiconductor package structure may be provided with conductive structures on at least three surfaces for connecting other PCBs, devices, and components.

According to the disclosed semiconductor packaging structure and packaging method, conductive structures are formed on multiple surfaces of the semiconductor package structure. Therefore, the semiconductor package structure can be connected to at least two PCBs from different directions. Also, compared to the wires in existing semiconductor package structures, the wires in the disclosed semiconductor package structure that are used to connect with different components can be effectively shortened. As such, parasitic resistance, capacitance, and inductance may be substantially reduced, which may further improve the high-frequency performance of the semiconductor package structure. In addition, because the semiconductor package structure can exchange electrical signals with more than one PCB, each PCB may also be made smaller. Therefore, not only the wires in the circuit layer of the PCB may be shortened, but the fabrication process of the PCB may be simplified.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor package structure, comprising:
    a substrate, including first conductive pads and packaging pads opposite to the first conductive pads;

one or more semiconductor chips stacking on the substrate;
a molding compound encapsulating the semiconductor chips;
first metal wires connecting the semiconductor chips to the packaging pads;
a first metal pad on a side of the molding compound opposite to the substrate; and
a second metal wire located in the molding compound and connecting the first metal pad to a chip-contact pad of a semiconductor chip of the semiconductor chips.

2. The semiconductor package structure according to claim 1, further including:
a first conductive structure on each first conductive pad of the first conductive pads.

3. The semiconductor package structure according to claim 2, wherein:
the first conductive structure includes one of a solder ball, a conductive pillar, and a conductive bump.

4. The semiconductor package structure according to claim 1, further including:
a redistribution layer on the molding compound, wherein the redistribution layer includes a second conductive pad exposed at a surface of the redistribution layer and electrically connected to the first metal pad.

5. The semiconductor package structure according to claim 1, wherein:
the second metal wire vertical extending from the chip-contact pad of the semiconductor chips to a surface of the molding compound.

6. The semiconductor package structure according to claim 1, wherein:
the second metal wire includes a vertical copper pillar.

7. The semiconductor package structure according to claim 1, wherein the substrate further includes:
conductive plugs extending in a direction perpendicular to the substrate and connecting the first conductive pads with the packaging pads.

8. The semiconductor package structure according to claim 1, wherein the substrate further includes:
a core substrate, the first conductive pads and the packaging pads are located on opposite sides of the core substrate.

9. The semiconductor package structure according to claim 8, wherein the substrate further includes:
a first solder resist (SR) layer on a first surface of the core substrate, wherein each first conductive pad of the first conductive pads is at least partially uncovered by the first SR layer; and
a second SR layer on a second surface of the core substrate, wherein each packaging pad of the packaging pads is at least partially uncovered by the second SR layer.

10. A semiconductor package structure, comprising:
a molding compound encapsulating vertically stacked semiconductor chips;
a substrate on a first side of the molding compound, the substrate comprising:
first conductive pads on a first side of a core substrate,
lower packaging pads on a second side of the core substrate, and
conductive plugs penetrating through the core substrate connecting the first conductive pads to the packaging pads;
a redistribution layer on a second side of the molding compound, the redistribution layer comprising:
upper packaging pads on a first side of the redistribution layer, and
second conductive pads on a second side of the redistribution layer;
first metal wires connecting the semiconductor chips to the lower packaging pads; and
second metal wires connecting the semiconductor chips of the upper packaging pads.

11. The semiconductor package structure according to claim 10, further including:
a first conductive structure on each first conductive pad.

12. The semiconductor package structure according to claim 11, wherein:
the first conductive structure includes one of a solder ball, a conductive pillar, and a conductive bump.

13. The semiconductor package structure according to claim 10, further including:
a second conductive structure on each second conductive pad.

14. The semiconductor package structure according to claim 13, wherein:
the second conductive structure includes one of a solder ball, a conductive pillar, and a conductive bump.

15. The semiconductor package structure according to claim 10, wherein the second conductive pads are electrically connected to the upper packaging pads.

16. The semiconductor package structure according to claim 10, wherein:
the second metal wires include vertical copper pillars.

17. The semiconductor package structure according to claim 10, wherein the substrate further includes:
a first solder resist layer on the first side of the core substrate and partially uncovering the first conductive pads.

18. The semiconductor package structure according to claim 10, wherein the substrate further includes:
a second solder resist layer on the second side of the core substrate and partially uncovering the lower packaging pads.

19. The semiconductor package structure according to claim 18, wherein the semiconductor chips are stacked on the second solder resist layer.

* * * * *